US007008810B2

(12) United States Patent
Höss et al.

(10) Patent No.: US 7,008,810 B2
(45) Date of Patent: Mar. 7, 2006

(54) METHOD FOR FABRICATING AT LEAST ONE MESA OR RIDGE STRUCTURE OR AT LEAST ONE ELECTRICALLY PUMPED REGION IN A LAYER OR LAYER SEQUENCE

(75) Inventors: Christine Höss, Regensburg (DE); Andreas Weimar, Regensburg (DE); Andreas Leber, Regensburg (DE); Alfred Lell, Maxhütte-Haidhof (DE); Helmut Fischer, Lappersdorf (DE); Volker Harle, Laaber (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 134 days.

(21) Appl. No.: 10/804,514

(22) Filed: Mar. 19, 2004

(65) Prior Publication Data

US 2004/0248334 A1    Dec. 9, 2004

(30) Foreign Application Priority Data

Mar. 19, 2003  (DE) ................................ 103 12 214

(51) Int. Cl.
*H01L 21/00* (2006.01)
(52) U.S. Cl. ................. 438/39; 438/951; 257/E21.025; 257/E21.034
(58) Field of Classification Search .................. 438/39, 438/951; 257/E21.025, E21.034
See application file for complete search history.

(56) References Cited

U.S. PATENT DOCUMENTS 4,296,386 A    10/1981  Tijburg et al.

(Continued)

FOREIGN PATENT DOCUMENTS

DE    101 47 791 A1    9/2001

(Continued)

OTHER PUBLICATIONS

Tsuyoshi Tojyo, et al., "High-Power AlGaInN Laser Diodes with High Kink Level and Low Relative Intensity Noise", Jpn. J. Appl. Phys. vol. 41, pp. 1829-1833, Mar. 2002.

(Continued)

*Primary Examiner*—George Fourson
*Assistant Examiner*—Thanh V. Pham
(74) *Attorney, Agent, or Firm*—Cohen, Pontani, Lieberman & Pavane

(57) ABSTRACT

A method for fabricating at least one mesa or ridge structure in a layer or layer sequence, in which a sacrificial layer (4) is applied and patterned above the layer or layer sequence. A mask layer is applied and patterned above the sacrificial layer for definition of the mesa or ridge dimensions. The sacrificial layer (4) and of the layer or layer sequence are removed so that the mesa or ridge structure is formed in the layer or layer sequence. A part of the sacrificial layer (4) is selectively removed from the side areas thereof which have been uncovered in the previous step, so that a sacrificial layer remains which is narrower in comparison with a layer that has remained above the sacrificial layer as seen from the layer or layer sequence. A coating is applied at least to the sidewalls of the structure produced in the previous steps so that the side areas of the residual sacrificial layer are not completely overformed by the coating material. The sacrificial layer (4) is removed so that the layer that has remained above the sacrificial layer as seen from the layer or layer sequence is lifted off. A method is also disclosed for fabricating at least one gain-controlled laser diode in a layer sequence, in which method steps analogous to those described above are employed.

23 Claims, 6 Drawing Sheets

U.S. PATENT DOCUMENTS

| | | | |
|---|---|---|---|
| 4,751,708 | A | 6/1988 | Jackson et al. |
| 4,949,352 | A | 8/1990 | Plumb |
| 5,139,968 | A * | 8/1992 | Hayase et al. ............... 438/577 |
| 5,426,658 | A | 6/1995 | Kaneno et al. |
| 6,605,519 | B1 * | 8/2003 | Lishan ....................... 438/555 |
| 6,661,822 | B1 | 12/2003 | Kubota et al. |
| 6,686,616 | B1 * | 2/2004 | Allen et al. ................. 257/280 |

FOREIGN PATENT DOCUMENTS

| | | |
|---|---|---|
| JP | 2001-015860 | 1/2001 |

OTHER PUBLICATIONS

Shin-ya Nunoue et al., "Reactive Ion Beam Etching and Overgrowth Process in the Fabrication of InGaN Inner Stripe Laser Diodes", Jpn. J.Appl. Phys. vol. 37, pp. 1470-1473, Mar. 1998.

M. Kuramoto et al., "Reduction of Internal Loss and Threshold Current in a Laser Diode with a Ridge by Selective Re-Growth (RiS-LD)", phys.stat.sol.(a) 192, No. 2, pp. 329-334 (2002).

Masaru Kuramoto et al., "Novel-Ridge InGaN Multiple-Quantum-Well Laser Diodes Fabricated by Selective Area Re-Growth on n-GaN Substrates", Jpn. J. Appl. Phys. vol. 40, pp. L925-L927, Sep. 15, 2001.

Akitaka Kimura et al., "Composition Control during Growth of AlGaN Cladding Layers for InGaN-MQW Lasers with Ridge Formed by Selective Re-growth (RiS-type Lasers)", Mat. Res. Soc. Symp. Proc. vol. 693, Materials Research Society, pp. 14.5.1-14.5.6 (2002).

Bulman G., et al. "InGaN/GaN laser diodes grown on 6H-SiC", pp. 616-622, Aug. 1998.

* cited by examiner

METHOD FOR FABRICATING AT LEAST ONE MESA OR RIDGE STRUCTURE OR AT LEAST ONE ELECTRICALLY PUMPED REGION IN A LAYER OR LAYER SEQUENCE

RELATED APPLICATION

This patent application claims the priority of German patent application 10312214.1, the disclosure content of which is hereby incorporated by reference.

FIELD OF THE INVENTION

The invention relates to a method for fabricating at least one mesa or ridge structure or at least one electrically pumped region in a layer or layer sequence. It relates, in particular, to a method for fabricating at least one mesa or ridge structure on or in a semiconductor layer sequence based-on nitride-III-V-compound semiconductor material for optoelectronic semiconductor chips. Furthermore, the invention relates, in particular, to a method for fabricating laser diodes based on nitride-III-V-compound semiconductor material with waveguide widths of less than or equal to 2 μm.

BACKGROUND OF THE INVENTION

Known methods for fabricating index-guided and gain-guided laser diode chips are described for example in DE 101 47 791. With the lithography technique (contact printing) which is proposed and available there, it is possible to obtain laser diodes with waveguide widths <2 μm only with a high technical effort. During the opening of a 0.5 μm wide window in the $SiO_2$ passivation, shunts increasingly occur in the case of small waveguide widths, said shunts arising as a result of alignment tolerances (0.5 μm) and run-out effects (up to 2 μm offset over a 2 in. wafer).

In the case of the RiS method (Ridge by Selective regrowth) disclosed for example by Kuramoto et al., Jpn. J. Appl. Phys., Vol. 40 (2001), pp. L925–927, Part 2, No. 9A/B; Kimura et al., Mat. Res. Soc. Symp. Proc. Vol. 693 (2002) and Kuramoto et al., phys. stat. sol. (a) 192, No. 2, 329–334 (2002), the epitaxy is interrupted after the growth of an upper waveguide. In a dielectric intermediate layer (e.g. $SiO_2$) subsequently deposited above that, strip-type windows are opened (patterning by means of photolithography and etching). In the second epitaxy step, the cladding layer of the waveguide and the contact layer grow in the window strips. This method requires a plurality of epitaxy steps. A variation of the index guidance, which can be achieved in the case of a ridge waveguide laser by changing the etching depth, is difficult.

A method for fabricating "InGaN Inner Stripe Laser Diodes", which method is similar to the RiS method described above, is described in Nunoue et al., Jpn. J. Appl. Phys., Vol. 37 (1998), pp. 1470–1473, Part 1, No. 3B.

The group of optoelectronic chips based on nitride-III-V-compound semiconductor material in the present case includes, in particular, those chips in which a semiconductor layer fabricated epitaxially, which generally comprises a layer sequence made of different individual layers, contains at least one individual layer which has a material from the nitride-III-V-compound semiconductor material system $In_x Al_y G_{1-x-y} N$ where $0 \leq x \leq 1$, $0 \leq y \leq 1$ and $x+y \leq 1$. The semiconductor layer may have, by way of example, a conventional pn junction, a double heterostructure, a single quantum well structure (SQW structure) or a multiple quantum well structure (MQW structure). Such layer sequences are known in principle to the person skilled in the art and, therefore, are not explained in any further detail at this point. They are described for example in Nunoue et al., Jpn. J. Appl. Phys., Vol. 37 (1998), pp. 1470–1473, Part 1, No. 3B; Kuramoto et al., Jpn. J. Appl. Phys., Vol. 40 (2001, pp. L925–927, Part 2, No. 9A/B; Kimura et al., Mat. Res. Soc. Symp. Proc. Vol. 693 (2002); Kuramoto et al., phys. stat. sol. (a) 192, No. 2, 329–334 (2002); Tojyo et al., Jpn. J. Appl. Phys. 41, 1829 (2002) and Bulman et al., in Properties, Processing and Applications of Gallium Nitride and Related Semiconductors, 616, (1998) the disclosure contents of which is in this respect hereby incorporated by reference.

SUMMARY OF THE INVENTION

One object of the invention is to provide a method for fabricating at least one mesa or ridge structure or at least one electrically pumped region in a layer or layer sequence, which method is self-aligning and can be used to fabricate, in particular, structure widths of less than or equal to 2 μm in a technically simplified manner.

When mention is made hereinafter of sacrificial layer, covering layer and mask layer, they may be an individual layer but also a sequence of two or more layers which fulfill the function of the sacrificial layer, the covering layer and the mask layer, respectively.

The above-mentioned object and other objects are attained in accordance with one aspect of the present invention directed to a method for fabricating at least one mesa or ridge structure in a layer or layer sequence, in which sidewalls of the mesa or ridge structure are provided with a coating applied after the uncovering thereof. A sacrificial layer is applied above the layer or layer sequence and a mask layer is applied and patterned above the sacrificial layer for definition of the mesa or ridge dimensions. The sacrificial layer, and the layer or layer sequence are partially removed to form the mesa or ridge structure in the layer or layer sequence. A part of the sacrificial layer is selectively removed from the side areas thereof which have been uncovered earlier, so that a sacrificial layer remains which is narrower in comparison with a layer that has remained above the sacrificial layer as seen from the layer or layer sequence. The coating is applied at least to the sidewalls of the structure produced in the above steps so that the side areas of the residual sacrificial layer are not completely overformed by the coating material. The sacrificial layer is then at least partially removed, so that the layer that has remained above the sacrificial layer as seen from the layer or layer sequence is lifted off.

In this case, the covering layer may have the function of an adhesion layer between mask layer and sacrificial layer or the function of an etching stop layer for the wet-chemical etching of the sacrificial layer, or both functions together. If the mask layer requires neither an adhesion layer nor an etching stop layer, the covering layer may be omitted.

In contrast to a traditional lift-off technique, the sacrificial layer particularly preferably comprises a different material than photoresist. Possible materials for the sacrificial layer are metals (such as gold, silver, aluminum, palladium, titanium), dielectrics (such as aluminum oxide, silicon oxide, silicon nitride), polymer layers (such as polyimide), epitaxially grown layers (such as InN, AlN, GaP, GaAs, InP) or suitable combinations of these materials.

In order to produce a window in the coating toward the layer or layer sequence, for example in order subsequently to apply an electrical connection metallization to the layer or layer sequence in the window, the sacrificial layer is preferably completely removed from the layer or layer sequence.

The method is especially preferably suitable for fabricating the geometrical ridge waveguide structure of a ridge waveguide laser diode chip, in particular based on $In_xAl_yGa_{1-x-y}N$ where $0 \leq x \leq 1$, $0 \leq y \leq 1$ and $x+y<1$. Ridge waveguide structures having a width of less than or equal to 2 μm, in particular of less than or equal to 1.5 μm, can advantageously be realized in a self-aligning manner by means of the method in a technically comparatively simple manner.

In an advantageous embodiment, the laser facets are produced by means of dry etching and the coating contains a reflective or antireflective layer system.

Another aspect of the present invention is directed to a method for fabricating at least one gain-controlled laser diode in a layer sequence, in particular based on $In_xAl_yGa_{1-x-y}N$ where $0 \leq x \leq 1$, $0 \leq y \leq 1$ and $x+y \leq 1$. A sacrificial layer is applied above the layer sequence and a mask layer is applied and patterned above the sacrificial layer. The sacrificial layer is partially removed in the regions not covered by the mask layer. The sacrificial layer is selectively removed from the side areas thereof which have been earlier uncovered, so that a sacrificial layer remains which is narrower in comparison with a layer that has remained above the sacrificial layer as seen from the layer sequence, which narrower sacrificial layer defines the electrically pumped region of the laser diode. A coating is applied at least to the sidewalls of the structure produced in the previous steps so that the side areas of the residual sacrificial layer are not completely overformed by the coating material. The sacrificial layer is at least partially removed, so that the layer that has remained above the sacrificial layer as seen from the layer or layer sequence is lifted off.

The method is advantageously suitable for fabricating light-emitting diode chips with coated side areas of the radiation-generating layer sequence. The geometrical structure of the radiation-generating layer sequence and the coating are produced by means of a method according to the invention. The method is suitable, in particular, for fabricating light-emitting diode chips having an edge length of less than or equal to 2 μm, in particular of less than or equal to 1.5 μm.

Semiconductor chips, in particular opto-semiconductor chips (e.g. index-controlled laser diodes, LEDs, high power lasers, detectors) with lateral coating can advantageously be fabricated in a self-aligning manner by means of the method.

The method is based on the use of a so-called sacrificial layer, which may comprise one or more dielectric layers ($SiO_2$, $Al_2O_3$, $Si_3N_4$, etc.), metallic layers (Au, Ag, Pd, Al), organic polymer layers, epitaxial layers (InN, GaAs, GaP, etc.) or a combination thereof.

The method can be used to realize a series of different fundamental goals for improving in particular opto-semiconductor chips (such as ridge waveguide laser chips, high power laser chips, trapezoidal laser chips; LED chips, etc.).

In the case of index-controlled semiconductor laser chips with electrically and optically passivated ridge sidewalls, the method makes it possible to achieve, inter alia, a reduction of the power consumption and an increase in the yield by means of defined narrow ridge widths and also a reduction of the fabrication effort.

In the case of gain-controlled semiconductor laser chips and arrays with electrical insulation made of dielectric layers, the method enables, inter alia, smaller structural widths with improved reproducibility (yield) and improved component characteristic data e.g. in the case of high power lasers and trapezoidal lasers.

In the case of diverse semiconductor laser chips (such as ridge lasers, stripline lasers, trapezoidal lasers, high power lasers, etc.) with dry-etched and reflection-coated laser facets, the method makes it possible to produce structures with an increased decoupling efficiency and to achieve simplified fabrication processes through on-wafer reflection coating.

In the case of diverse semiconductor laser chips (ridge lasers, stripline lasers, trapezoidal lasers, high power lasers, etc.) with passivated or absorbently coated chip side edges, the method makes it possible to produce structures in which undesirable ring modes are suppressed by absorber layers. This advantageously leads to an increase in the component efficiency and to the reduction or avoidance of leakage currents.

In the case of index-controlled and gain-controlled lasers, it is possible, with the aid of the sacrificial layer, to fabricate semiconductor laser diodes with a laterally passivated ridge waveguide in a self-aligning manner. The method makes it possible, in particular, to process index-controlled laser diodes with a small waveguide width (<2 μm) in conjunction with high yield. It is possible to employ conventional photolithography techniques (for example by means of contact printing). Waveguide structures having a small width are necessary principally in the range of short wavelengths, since they allow expectation of kink-free operation (i.e., a diagram showing the optical output power vs. the electrical current has no kinks or singularities which would indicate that undesired higher laser modes start to oscillate in the laser resonator) at low threshold currents.

During the fabrication of such laser structures, a sacrificial layer made of a metallic, dielectric or organic material is applied to the semiconductor layer to be patterned, said material being able to be etched or stripped selectively with respect to the semiconductor layer material and with respect to the etching mask. In this case, the sacrificial layer may be enclosed between other layers, e.g. current expansion layer(s) and/or adhesion promoting layer(s). A material (e.g. $SiO_2$, $Si_3N_4$, metal, photoresist) applied above the sacrificial layer is patterned by means of photolithography, for example, to form an etching mask for the semiconductor layer. Subsequent wet- or dry-chemical etching of the sacrificial layer causes an undercut on both sides of the patterned ridge. Once the ridge waveguide has been fabricated by wet- or dry-chemical etching of the semiconductor layer, it is possible to apply a passivation layer (dielectric or organic) as a waveguide cladding layer and for electrical insulation over the whole area.

What is achieved by optimizing the sacrificial layer thickness, the undercut of the sacrificial layer and also the thickness, the material and/or the deposition method for the passivation is that the sacrificial layer is not completely overformed laterally by the passivation. Etching or stripping or mechanical influencing (e.g. ultrasound, compressed air, mechanical wiping, etc.) of the sacrificial layer through these lateral openings lifts off the overlying etching mask and simultaneously opens a window in the passivation on the ridge, through which the semiconductor can be electrically connected.

The method is advantageously self-aligning. A shunt problem, which occurs over the entire wafer region in the case of conventional methods for fabricating ridge lasers, is thus eliminated to the greatest possible extent because alignment tolerances virtually no longer play a part in the lithography. By minimizing the undercut of the sacrificial layer (for example approximately 200–300 nm on both sides), the contact window in the passivation may become almost as wide as the ridge waveguide. In conjunction with the p-type contact metallization described in DE 101 47 791 A1 (DE 101 47 791 A1 is in this respect hereby incorporated by reference) below the passivation, the electrical connection pad is optimized. In the case of p-side-down mounting, the thermal power loss can advantageously be better dissipated via the now wider metallization and the lifetime of the component is thereby increased. By saving a photolithography, a risk of fracture and a throughput time of the ridge laser process decrease and the yield (principally of components having small waveguide widths) increases significantly.

In the case of semiconductor lasers (e.g. high power lasers; ridge lasers; trapezoidal lasers) with (dry-) etched and subsequently passivated or reflection-coated laser facets, the self-alignment technology provided by the method affords an optimum alignment of etched and subsequently passivated structures. The method has the advantage that although an etching mask and a lift-off mask may be arranged in a self-aligning manner, they may comprise different layer systems. Furthermore, a standard lift-off technique with photoresist may advantageously be used. With the low-solvent mask (generally photoresist) which is eroded during the dry etching process, it is advantageous that it is not necessary to undertake the attempt (usually in vain) to lift off a structure coated above it.

In the case of LED chips with passivated chip side areas, leakage currents are advantageously reduced or avoided, which leads to an improvement of component properties (e.g. the breakdown strength). LED chips with passivation of the chip side areas (e.g. by application of dielectric passivation layers such as silicon dioxide, silicon nitride, aluminum oxide) can be improved in terms of their electrical (blocking) behavior.

Further advantages and advantageous refinements and developments of the method emerge from the exemplary embodiments described below in conjunction with FIGS. 1a to 3.

DETAILED DESCRIPTION OF THE INVENTION

Figure 1A:
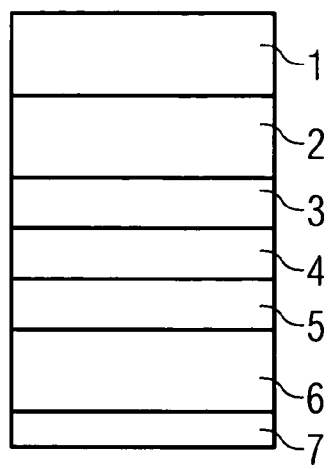
FIGS. 1A to 1G show sections through a layer sequence for a ridge waveguide laser diode chip in different method stages of a first exemplary embodiment.
Figure 1B:
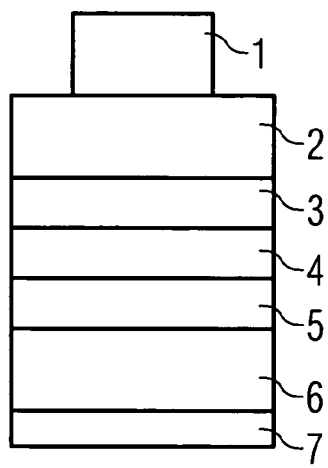
Figure 1C:
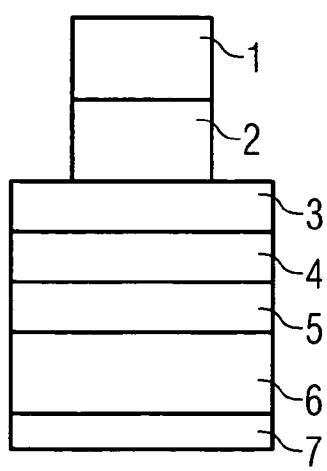
Figure 1D:
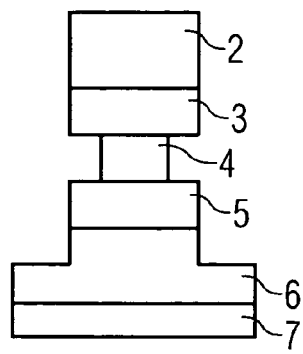
Figure 1E:
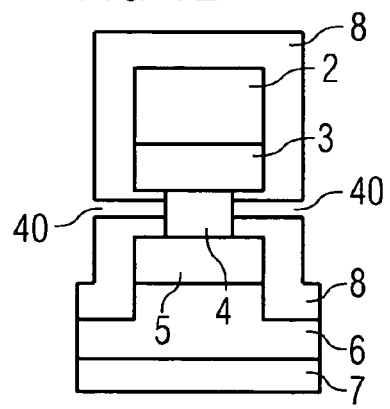

In the various exemplary embodiments, identical or identically acting constituent parts are in each case provided with the same designations and reference symbols. The drawings of FIGS. 1A to 4C are expressly not to scale. The layer thicknesses used in these drawings cannot be used to deduce the ratio of the real layer thicknesses. Furthermore, only the steps which are essential for explaining the invention are described in the exemplary embodiments. It goes without saying that the method sequences described do not in any case represent a complete fabrication process for the respective chip.

In the exemplary embodiment illustrated diagrammatically in FIGS. 1A to 1G, a metal layer sequence, comprising a Pt p-type contact metal layer 5 (thickness approximately 40 nm), a sacrificial layer (or lift-off layer) 4 made of Au (thickness approximately 300 nm) and a covering layer 3 made of Pt (thickness approximately 10 nm), is deposited (for example by means of vapor deposition or sputtering) over the whole area of an epitaxial layer sequence 6 applied on an SiC substrate (SiC wafer) 7 for a ridge waveguide laser diode chip based on $In_xAl_yGa_{1-x-y}N$ where $0 \leq x \leq 1$, $0 \leq y \leq 1$ and $x+y \leq 1$. A first mask layer 2 applied over the whole area thereof, said mask layer having a thickness of approximately 500 nm and being made of $SiO_2$, is patterned as a hard mask in a first photolithographic step by means of RIE (reactive ion etching), the ridge waveguide width being defined by a previously patterned second mask layer 1, here a developed and patterned photoresist layer having a thickness of approximately 1.8 $\mu$m. In this respect, cf. FIGS. 1A to 1C.

After the stripping of the photoresist layer 1 and dry etching of the Pt covering layer 3, the Au sacrificial layer 4 can be etched wet-chemically. In this case, a lateral undercut of the sacrificial layer 4 limits the smallest ridge width which can be processed. A deep etching (for example by means of RIE) of the epitaxial layer sequence 6 is effected after the dry etching of the Pt p-type contact metal layer 5. In this respect, cf. FIG. 1D.

Afterward, a passivation or insulating layer 8 made of $SiO_2$ having a thickness of approximately 250 nm is deposited over the whole area by means of CVD or sputtering. The thickness of the sacrificial layer 4, the thickness of the passivation or insulating layer 8 and the CVD/sputtering process are coordinated with one another in such a way that the passivation or insulating layer 8 does not completely overform the sacrificial layer 4, rather lateral sidewalls are left free and accessible. In this respect, cf. FIG. 1E. This is accomplished primarily by selecting a thickness for insulating layer 8.

Figure 1F:
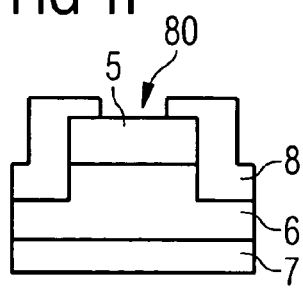

The lateral openings 40 in the passivation or insulating layer 8, which are at the level of the sacrificial layer 4, make it possible, by means of wet-chemical etching of the sacrificial layer 4, to lift off the latter together with the first mask layer 2 and the second mask layer 1 and to uncover the Pt p-type contact metal layer 5 through a window 80 in the passivation or insulating layer 8, said window being formed on the ridge in the process (FIG. 1F). Although use of wet-chemical etching is preferred for the lift-off task, various etching, stripping or mechanical influences can be applied (e.g., ultrasound, compressed air, mechanical wiping) to the sacrificial layer through lateral openings 40.

Figure 1G:
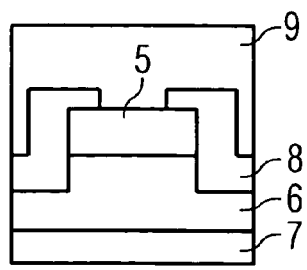
Figure 2A:
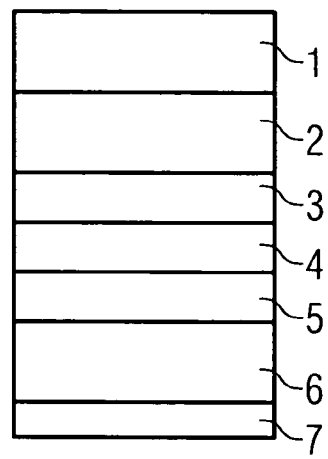
FIGS. 2A to 2G show sections through a layer sequence for a stripline laser diode chip in different method stages of a second exemplary embodiment.
Figure 2B:
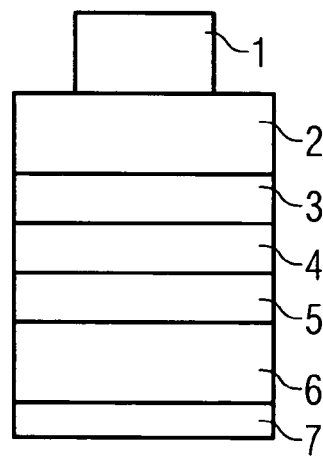
Figure 2C:
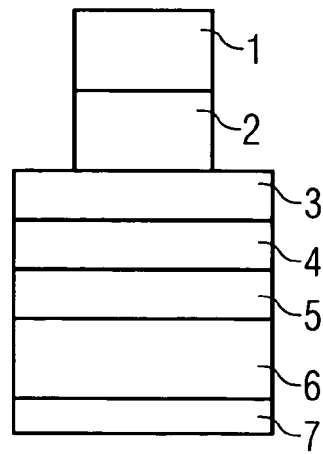
Figure 2D:
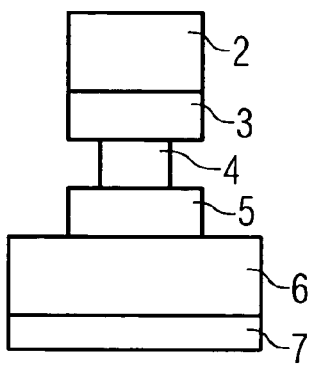
Figure 2E:
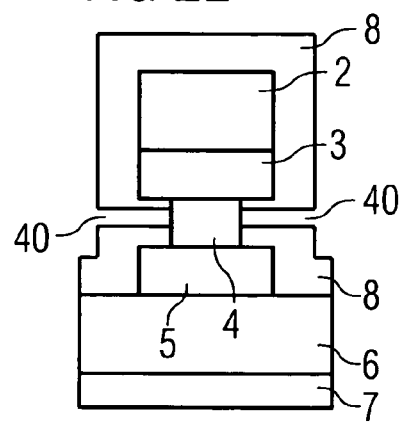
Figure 2F:
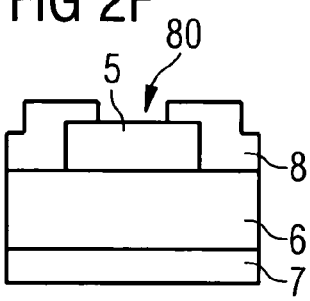
Figure 2G:
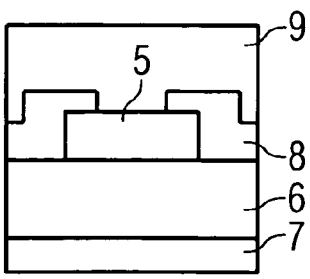

After a Ti/Au connection metal layer 9 has been deposited over the whole area, the p-type contact of the ridge waveguide laser diode chip is electrically connected via said window 80 (FIG. 1G). The Ti/Au metal layer 9 is subsequently patterned by means of photolithography and etching.

Thus, overall, only two lithography steps are required for the ridge waveguide laser diode process.

The method for fabricating a stripline laser diode chip based on $In_xAl_yGa_{1-x-y}N$ where $0 \leq x \leq 1$, $0 \leq y \leq 1$ and $x+y \leq 1$, which method is illustrated in FIGS. 2A to 2G, differs from the method described above in conjunction with FIGS. 1A to 1G essentially only by the fact that no deep etching of the epitaxial layer sequence 6 is effected for a stripline laser diode chip. In this respect, cf. FIG. 2D.

Figure 3:
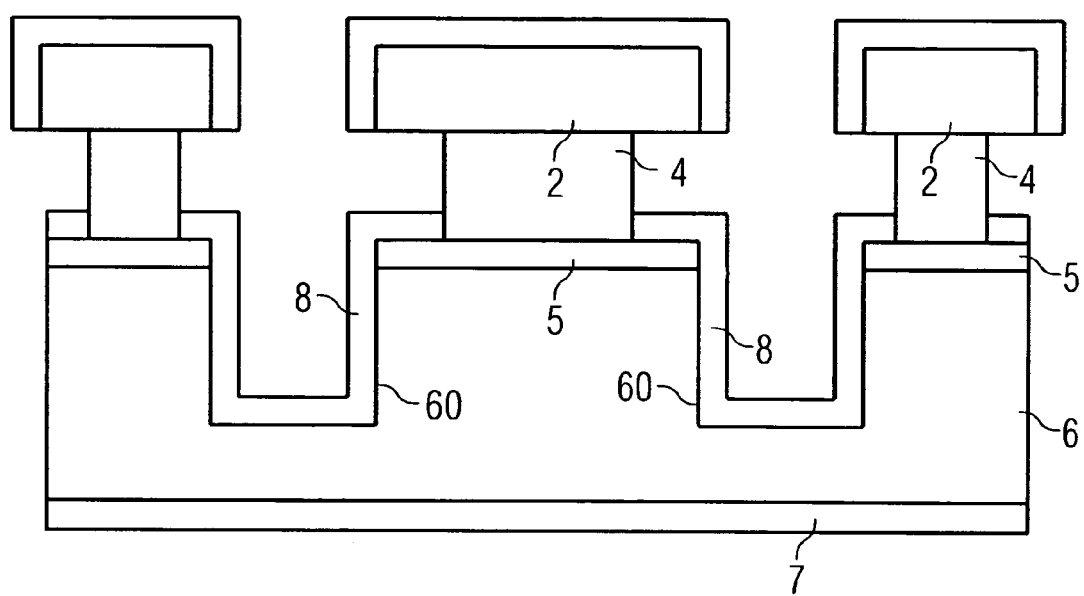
FIG. 3 shows a section through a ridge waveguide laser with dry-etched mirror facets.

In the case of the ridge waveguide laser structure which is illustrated in FIG. 3, it is fabricated by a method essentially according to the first exemplary embodiment described above (although cover layer 3 has been omitted). The ridge waveguide laser has mirror facets 60 defining the laser resonator of the ridge waveguide laser which extends in a lateral direction. Preferably, the mirror facets are formed by a dry etch process. Fabricating the mirror facets 60 by means of dry etching simplifies fabrication and handling, since a scribing and breaking and possibly a thickness processing of the wafer can be obviated or effected only after an on-wafer facet coating.

The action of the anisotropic dry etching component on the facets 60 is facilitated by thin etching masks given the same coverage density of the components. If the dry etching mask 2 is situated on an incipiently etched sacrificial layer 4, then the facets 60, dry-etched e.g. by means of CAIBE, can be reflection-coated or antireflection-coated with dielectric layer systems (lambda/4 layer (pair)(s)) whilst still joined in the wafer. After the lift-off of the sacrificial layer 4, the bonding pads or the p-type metal layer are accessible for electrical connection.

Figure 4A:
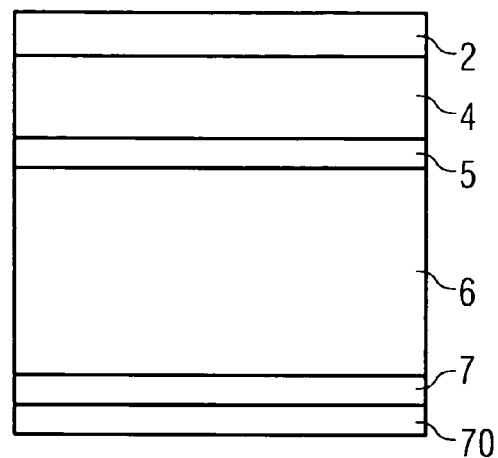
FIGS. 4A to 4C show sections through a layer sequence for a light-emitting diode chip in different method stages of a second exemplary embodiment.
Figure 4B:
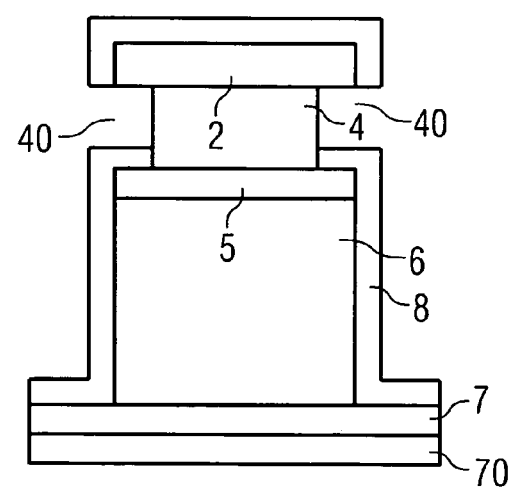
Figure 4C:
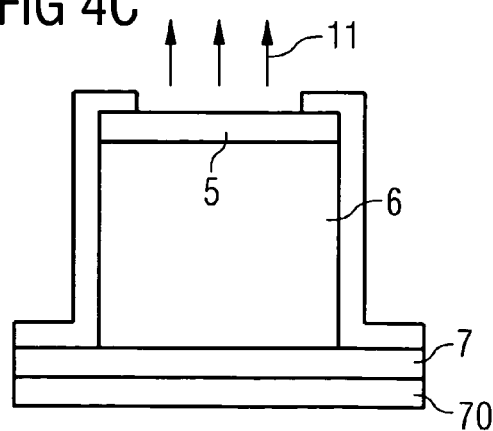

The exemplary embodiment in accordance with FIGS. 4A to 4C for fabricating a light-emitting diode chip $In_xAl_yGa_{1-x-y}N$ where $0 \leq x \leq 1$, $0 \leq y \leq 1$ and $x+y \leq 1$ comprises a mask layer 2 for mesa etching, which is situated on a sacrificial layer 4. A reflection-coated contact metallization 70 is applied at the rear side of the SiC substrate 7. cf. FIG. 4A.

The mesa patterning of the radiation-emitting epitaxial layer sequence 6 based on $In_xAl_yGa_{1-x-y}N$ where $0 \leq x \leq 1$, $0 \leq y \leq 1$ and $x+y \leq 1$ is followed by the application of a dielectric passivation layer 8 to the four side areas by whole-area application of dielectric layers, e.g. made of $SiO_2$ (FIG. 4B). The lift-off of the sacrificial layer 4 together with the etching mask layer 2 results in the uncovering of the p-type contact 5 for electrical connection and for the decoupling of light (indicated by the arrows 11 in FIG. 4C).

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

Thus, by way of example, between the layer or layer sequence and the sacrificial layer and between the sacrificial layer and the mask layer there may be present one or more further layers which have additional functions, without the respective method departing from the technical teaching provided by the present invention.

We claim:

1. A method for fabricating at least one mesa or ridge structure in a layer or layer sequence, in which sidewalls of the mesa or ridge structure are provided with a coating applied after the uncovering thereof, having the following method steps:
   a) application of a sacrificial layer above the layer or layer sequence;
   b) application and patterning of a mask layer above the sacrificial layer for definition of the mesa or ridge dimensions;
   c) partial removal of the sacrificial layer and of the layer or layer sequence, to form the mesa or ridge structure in the layer or layer sequence;
   d) selective removal of a part of the sacrificial layer from the side areas thereof which have been uncovered in step c), so that a sacrificial layer remains which is narrower in comparison with a layer that has remained above the sacrificial layer as seen from the layer or layer sequence;
   e) application of the coating at least to the sidewalls of the structure produced in steps a) to d) so that the side areas of the residual sacrificial layer are not completely overformed by the coating material; and
   f) at least partial removal of the sacrificial layer, so that the layer that has remained above the sacrificial layer as seen from the layer or layer sequence is lifted off.

2. The method as claimed in claim 1, in which, in step f), the sacrificial layer is removed completely, to produce a window toward the layer or layer sequence in the coating.

3. The method as claimed in claim 2, in which an electrical connection metallization is applied to the layer or layer sequence in the window.

4. A method for fabricating at least one ridge waveguide laser diode chip based on $In_xAl_yGa_{1-x-y}N$ where $0 \leq x \leq 1$, $0 \leq y \leq 1$ and $x+y \leq 1$, in which the geometrical ridge waveguide structure is fabricated by means of a method as claimed in claim 1.

5. The method as claimed in claim 4, in which the width of the ridge waveguide structure is less than or equal to 2 $\mu$m.

6. The method as claimed in claim 4, in which, in step c), the facets of the laser diode chip are produced by means of dry etching and the coating contains a reflective or antireflective layer system.

7. A method for fabricating at least one light-emitting diode chip with coating of the side areas of the radiation-generating layer sequence, in which the geometrical structure of the radiation-generating layer sequence and coating are produced by means of a method as claimed in claim 1.

8. The method as claimed in claim 7, in which an edge length of the light-emitting diode chip is less than or equal to 2 $\mu$m.

9. A method for fabricating at least one gain-controlled laser diode in a layer sequence, in particular based on $In_xAl_yGa_{1-x-y}N$ where $0 \leq x \leq 1$, $0 \leq y \leq 1$ and $x+y \leq 1$, having the following method steps:
   a) application of a sacrificial layer above the layer sequence;
   b) application and patterning of a mask layer above the sacrificial layer;
   c) partial removal of the sacrificial layer in the regions not covered by the mask layer;
   d) selective removal of a part of the sacrificial layer from the side areas thereof which have been uncovered in step c), so that a sacrificial layer remains which is narrower in comparison with a layer that has remained above the sacrificial layer as seen from the layer sequence, which narrower sacrificial layer defines the electrically pumped region of the laser diode;
   e) application of a coating at least to the sidewalls of the structure produced in steps a) to d) so that the side areas of the residual sacrificial layer are not completely overformed by the coating material; and
   f) at least partial removal of the sacrificial layer, so that the layer that has remained above the sacrificial layer as seen from the layer or layer sequence is lifted off.

10. The method as claimed in claim 9, in which the width of the pumped region is less than or equal to 2 $\mu$m.

11. The method as claimed in claim 9, in which, in step f), the sacrificial layer is removed completely, so that a window toward the layer sequence is produced in the coating.

12. The method as claimed in claim 11, in which an electrical connection metallization is applied to the layer sequence in the window.

13. The method as claimed in claim 9, in which the sacrificial layer comprises a metal, a dielectric, a polymer, an epitaxially grown material or a combination of these materials.

14. The method as claimed in claim 9, in which step b) effects the application and patterning of a first mask layer above the sacrificial layer and a second mask layer above the first mask layer.

15. The method as claimed in claim 9, in which a covering layer is applied before the application of the mask layer above the sacrificial layer.

16. The method as claimed in claim 10, in which the width of the ridge waveguide structure, the edge length or, respectively, the width of the pumped region is less than or equal to 1.5 µm.

17. The method as claimed in claim 1, in which the sacrificial layer comprises a metal, a dielectric, a polymer, an epitaxially grown material or a combination of these materials.

18. The method as claimed in claim 1, in which step b) effects the application and patterning of a first mask layer above the sacrificial layer and a second mask layer above the first mask layer.

19. The method as claimed in claim 1, in which a covering layer is applied before the application of the mask layer above the sacrificial layer.

20. The method as claimed in claim 4, in which the width of the ridge waveguide structure, the edge length or, respectively, the width of the pumped region is less than or equal to 1.5 µm.

21. The method as claimed in claim 8, in which the width of the ridge waveguide structure, the edge length or, respectively, the width of the pumped region is less than or equal to 1.5 µm.

22. The method of claim 1, wherein said partial removal of the sacrificial layer is done by anisotropic etching.

23. The method of claim 9, wherein said partial removal of the sacrificial layer is done by anisotropic etching.

* * * * *